(12) United States Patent
Shah et al.

(10) Patent No.: US 12,278,150 B2
(45) Date of Patent: Apr. 15, 2025

(54) SEMICONDUCTOR PACKAGE WITH ANNULAR PACKAGE LID STRUCTURE

(71) Applicant: ADVANCED MICRO DEVICES, INC., Santa Clara, CA (US)

(72) Inventors: Priyal Shah, Santa Clara, CA (US); Brett P. Wilkerson, Austin, TX (US); Raja Swaminathan, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 286 days.

(21) Appl. No.: 17/490,943

(22) Filed: Sep. 30, 2021

(65) Prior Publication Data

US 2023/0093924 A1    Mar. 30, 2023

(51) Int. Cl.
| | |
|---|---|
| *H01L 23/053* | (2006.01) |
| *H01L 21/48* | (2006.01) |
| *H01L 21/52* | (2006.01) |
| *H01L 23/367* | (2006.01) |
| *H01L 23/498* | (2006.01) |

(52) U.S. Cl.
CPC ........ *H01L 23/053* (2013.01); *H01L 21/4853* (2013.01); *H01L 21/52* (2013.01); *H01L 23/367* (2013.01); *H01L 23/49816* (2013.01)

(58) Field of Classification Search
CPC ... H01L 23/053; H01L 21/4853; H01L 21/52; H01L 23/367

USPC .......................................................... 257/692
See application file for complete search history.

(56) References Cited

U.S. PATENT DOCUMENTS

| | | | |
|---|---|---|---|
| 2012/0139093 A1* | 6/2012 | Start .................... | H01L 23/4275 438/122 |
| 2017/0162542 A1* | 6/2017 | Chen ....................... | H01L 21/56 |
| 2019/0393121 A1* | 12/2019 | Swaminathan ........ | H01L 23/367 |
| 2020/0051894 A1* | 2/2020 | Wan ....................... | H01L 23/427 |

* cited by examiner

*Primary Examiner* — Quoc D Hoang (57) ABSTRACT

A semiconductor package includes a substrate having opposing first and second surfaces as well as a semiconductor chip component disposed at the second surface and having third and fourth opposing surfaces. A package lid structure is affixed to the second surface of the substrate and the fourth surface of the semiconductor chip component, and has a planar component overlying the semiconductor chip component and having a fifth surface facing the fourth surface and an opposing sixth surface. The planar component includes an aperture extending between the fifth surface and the sixth surface so as to expose at least a portion of the fourth surface of the semiconductor chip component. A thermal exchange structure can be mounted on the package lid structure to form a thermal extraction pathway with the semiconductor die component via the aperture, either directly or via an interposing thermally conductive plate.

24 Claims, 6 Drawing Sheets

SEMICONDUCTOR PACKAGE WITH ANNULAR PACKAGE LID STRUCTURE

BACKGROUND

Semiconductor packages (also commonly referred to as integrated circuit (IC) packages) typically utilize one or more individual die or molded chip modules (MCM) disposed on a common substrate. High thermal design power (TDP) semiconductor package implementations often utilize either a stiffener ring or a package lid to provide mechanical rigidity to protect against warpage and other mechanical stress. However, conventional stiffener/lidded solutions often provide an inadequate trade-off between mechanical rigidity and thermal dissipation via an overlying heat sink or other thermal solution. For example, a stiffener ring approach provides for high thermal performance as a heat sink or other thermal solution can be provided with a direct thermal coupling with the underlying die or MCM(s) via a thermal interface material (TIM), but typically provides inadequate mechanical performance as the stiffener ring lacks structural support spanning over the die or MCM(s). Conversely, a conventional lidded approach provides for relatively high mechanical performance as the implemented package lid completely encompasses the die or MCM(s) positioned underneath, but often exhibits relatively poor thermal performance as the completely solid body of the lid is interposed between the die or MCM(s) and the heat sink or other thermal solution. Moreover, a conventional lidded solution utilizing a metal-based TIM typically cannot be used for ball grid array (BGA) implementations or other solder-based connector solutions that require a solder reflow as the metal-based TIM typically does not maintain structural integrity through the reflow process. Moreover, the metal-based TIM in this approach typically is not well suited for MCMs as the reliability of the backside metallization on the molded chip typically is unknown. Conversely, the use of organic/polymeric TIM for such conventional lidded package approaches allows the use of BGA and other reflow-dependent package connector solutions but inhibits overall thermal performance due to the relatively poor thermal performance of most organic/polymeric TIMs compared to many metal-based TIMs.

SUMMARY OF EMBODIMENTS

In accordance with one aspect, a semiconductor package includes a substrate having a first surface and an opposing second surface and a semiconductor chip component disposed at the second surface of the substrate and having a third surface facing the second surface of the substrate and an opposing fourth surface. The semiconductor package further includes a package lid structure affixed to the second surface of the substrate, the package lid structure comprising a planar component overlying the semiconductor chip component and having a fifth surface facing the fourth surface and an opposing sixth surface, the planar component comprising an aperture extending between the fifth surface and the sixth surface so as to expose at least a portion of the fourth surface of the semiconductor chip component.

In various embodiments, the aspect above can include one or more of: a thermally conductive plate disposed in the aperture of the package lid structure and having a seventh surface thermally coupled to the fourth surface of the semiconductor chip component and an opposing eighth surface; the seventh surface is thermally coupled to the eighth surface using one of a metal-based thermal interface material or a polymeric thermal interface material; a dimension between the fifth surface and the sixth surface is one of: equal to a dimension between the seventh surface and the eighth surface; less than the dimension between the seventh surface and the eighth surface; or greater than the dimension between the seventh surface and the eighth surface; further including a thermal exchange structure affixed to the sixth surface of the planar component of the package lid structure and thermally coupled to the eighth surface of the thermally conductive plate via a thermal interface material, wherein the thermal interface material is a metal-based thermal interface material; and/or an array of solder-based connectors disposed at the first surface of the substrate.

In various embodiments, the aspect and embodiments above further can include one or more of: the package lid structure is thermally coupled to at least a portion of a perimeter of the fourth surface of the semiconductor chip component via a thermal interface material; wherein the package lid structure comprises a monolithic structure comprising the planar component and a riser component extending between the planar component and the second surface of the substrate; wherein the package lid structure comprises a polylithic structure comprising a planar segment component comprising the planar component, the planar segment component having a perimeter that extends beyond a perimeter of the semiconductor chip component and a separate riser segment component structure affixed to the perimeter of the planar segment component that extends beyond the perimeter of the semiconductor chip component via at least one adhesive layer; wherein the package lid structure is thermally coupled to the fourth surface of the semiconductor chip component via a metal-based thermal interface material, the semiconductor package further comprises an array of solder-based connectors disposed at the first surface of the substrate, and wherein a melting point of the metal-based thermal interface material is lower than a melting point of a solder of the solder-based connectors; a thermal exchange structure thermally coupled, using a thermal interface material, to the fourth surface of the semiconductor chip component via the aperture; an array of solder-based connectors disposed at the first surface of the substrate and wherein the thermal interface material comprises a metal-based thermal interface material with a melting point lower than a melting point of a solder of the solder-based connectors; wherein the thermal exchange structure comprises a protrusion on a surface facing the fourth surface, the protrusion positioned to extend into the aperture so as to thermally couple with the fourth surface via the thermal interface material; wherein the thermal exchange structure comprises one of a heat sink, a heat spreader, a heat pipe, a phase change material reservoir, or a fluid circulation structure; and/or wherein the semiconductor chip component comprises one of an integrated circuit die or a molded chip module.

In another aspect, a system can include a carrier structure having a ninth surface; and the semiconductor package of the above aspect and embodiments disposed at the ninth surface. The system can comprise one of a server, a client workstation, or a graphics card.

In accordance with another aspect, a method includes providing a workpiece comprising a substrate having a first surface and an opposing second surface and a semiconductor chip component disposed at the second surface of the substrate and having a third surface facing the second surface of the substrate and an opposing fourth surface, and affixing a package lid structure to the second surface of the substrate and thermally coupling the package lid structure to the fourth surface of the semiconductor chip component via a thermal interface material, the package lid structure comprising a planar component overlying the semiconductor chip component and having a fifth surface facing the fourth surface and an opposing sixth surface, the planar component comprising an aperture extending between the fifth surface and the sixth surface so as to expose at least a portion of the fourth surface of the semiconductor chip component.

In various embodiments, the method further can include one or more of: positioning a thermally conductive plate in the aperture of the package lid structure such that a seventh surface of the thermally conductive plate faces, and is thermally coupled to, the fourth surface of the semiconductor chip component; affixing a thermal exchange structure to at least one of the sixth surface of the planar component of the package lid structure, and thermally coupling the thermal exchange structure to an eighth surface of the thermally conductive plate opposite of the seventh surface via a thermal interface material; prior to positioning the thermally conductive plate and affixing the thermal exchange structure, performing a solder reflow process to reflow an array of solder-based connectors disposed at the first surface of the substrate, and subsequent to the solder reflow process, disposing a thermal interface material in the aperture at the fourth surface, the thermal interface material having a melting point lower than a melting point of a solder of the solder-based connectors; disposing a thermal interface material in the aperture at the fourth surface of the semiconductor die component and affixing a thermal exchange structure to at least one of the sixth surface of the planar component of the package lid structure such that a protrusion on a surface of the thermal exchange structure facing the sixth surface extends into the aperture and is thermally coupled to the fourth surface via the thermal interface material; and/or prior to disposing the thermal interface material and affixing the thermal exchange structure, performing a solder reflow process to reflow an array of solder-based connectors disposed at the first surface of the substrate, wherein the thermal interface material has a lower melting point than a solder of the solder-based connectors.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

DETAILED DESCRIPTION

Heat sinks, heat pipes, heat spreaders, phase change material (PCM) reservoirs, fluid circulation structures, and other active or passive thermal exchange structures can provide effective thermal performance for a semiconductor package when efficiently thermally coupled to the semiconductor die or molded chip module (MCM) that acts as the source of the thermal energy being dissipated. However, the semiconductor package often also requires a mechanical solution to mitigate warpage and other mechanical stress in the form of a package lid, and conventional package lid implementations impair the thermal performance of the employed thermal exchange structure as they form a complete thermally-inefficient barrier between the die/molded chip module (MCM) and the thermal exchange structure, and thus require at least two layers of thermal interface material (TIM) in the thermal extraction path between die/MCM and thermal exchange structure: a first TIM layer between the die/molded chip module and the overlying package lid, and a second TIM layer between the overlying package lid and the facing surface of the thermal exchange structure. The need for two TIM layers can negatively impact efficient thermal conductive performance. This is particularly the case when the TIM layers are required to have high melting points due to the need to perform a solder reflow process when the semiconductor package employs a ball grid array (BGA) or other solder-based connector implementation, as such high-melting-point TIMs typically have lower thermal performance than lower-melting-point TIMs.

To provide an improved balance between thermal performance and mechanical performance, in various embodiments a semiconductor package utilizes a package lid structure that employs one or more apertures aligned with the underlying semiconductor die component (that is, an individual semiconductor die or a molded chip module) such that the "top" surface of the underlying semiconductor die component is exposed via the one or more apertures, thereby allowing either a thermal exchange structure to be directly thermally coupled to the surface of the underlying semiconductor die component via a single TIM layer, or via an interposing thermally conductive plate that can be positioned in an aperture after the semiconductor package has been affixed to a printed circuit board (PCB) or other electrical interconnect carrier structure, and thus after any solder reflow process that may be required to provide the electrical and mechanical connection between semiconductor package and electrical interconnect carrier structure. The implementation of a package lid structure with one or more such apertures (referred to herein as an "annular package lid structure" for ease of reference) thus supplies the equivalent mechanical performance of a conventional package lid while also supplying the equivalent thermal performance of conventional lidless stiffener ring.

Note that in the following, certain positional terms, such as up, down, top, bottom, and the like, are used in a relative sense to describe the positional relationship of various components. These terms are used with reference to the relative position of components as shown in the corresponding figure and are not intended to be interpreted in an absolute sense with reference to a field of gravity. Thus, for example, a surface shown in the drawing and referred to as a top surface of a component would still be properly understood as being the top surface of the component, even if, in implementation, the component was placed in an inverted position with respect to the position shown in the corresponding figure and described in this disclosure.

Figure 1:
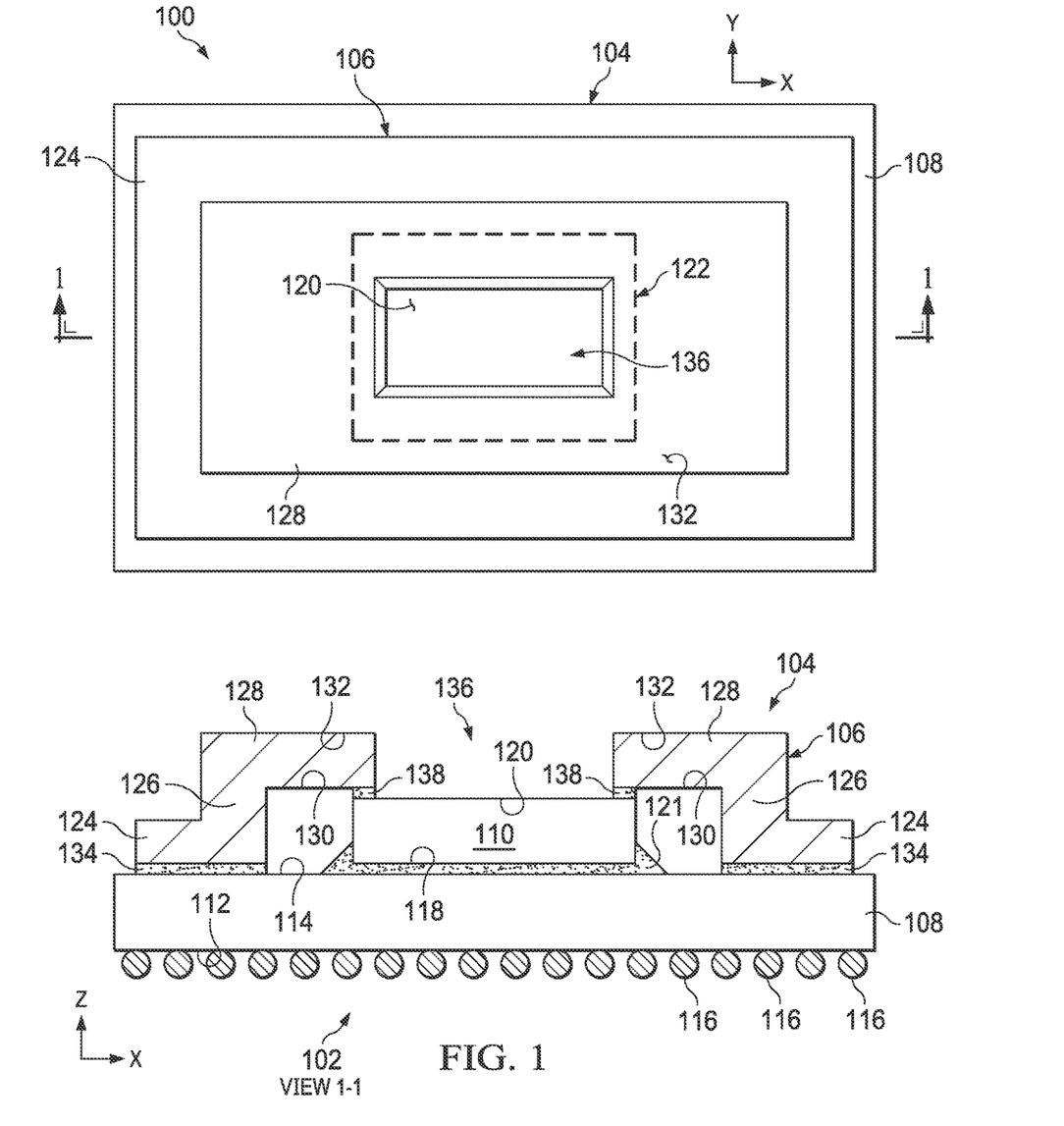
FIG. 1 is a top view and cross-section view of a semiconductor package having a package lid structure with an aperture to provide access to a surface of an underlying semiconductor device component in accordance with some embodiments.

FIG. 1 illustrates a top view 100 and cross-section view 102 (along line 1-1) of a semiconductor package 104 employing an "annular" package lid structure 106 in accordance with some embodiments. In the depicted example, the semiconductor package 104 includes the aforementioned annular package lid structure 106, a substrate 108, and at least one semiconductor die component 110. The substrate 108 can comprise any of a variety of electrical interconnect substrates (or "interposers") employed to provide mechanical support and an electrical interface between an underlying PCB or other carrier and the semiconductor die component 110, such as an epoxy-based laminate substrate (e.g., FR4), a Bismaleimide-Triazine (BT)-based laminate substrate, and the like. The substrate 108 includes a first major surface 112 and an opposing second major surface 114, along with one or more metal layers, vias, through silicon vias (TSVs), and other conductive structures to provide electrically conductive pathways between the surfaces 112, 114 or between points on the same surface. An array of package connectors 116 is disposed at the surface 112 to provide electrical and mechanical connections between corresponding electrically conductive pathways of the substrate 108 and a PCB or other carrier structure (not shown) upon which the semiconductor package 104 is mounted. The array of package connectors 116 can comprise solder-based connectors, such as solder balls of a ball grid array (BGA), pin-based connectors, such as the pins of a land grid array (LGA), flat connectors such in a quad flat package (QFP) array, and the like.

The semiconductor die component 110 is one of a single integrated circuit (IC) die (or "chip"), a single IC die package, or a set of chips (also known as "chiplets") vertically or horizontally stacked and formed into a molded chip module (MCM) (also commonly referred to as a "multi-chip module"). The semiconductor die component 110 implements one or more IC components of the semiconductor package 104, such as one or more central processing units (CPU), graphics processing units (GPUs), machine learning (ML) accelerators, or combinations thereof, as well as associated circuitry, such as memory controllers, input/output (I/O) controllers, data/controller interconnects, on-chip memory and caches, and the like. The semiconductor die component 110 has a third major surface 118 facing the second surface 114 of the substrate 108 and an opposing fourth major surface 120. The semiconductor package 104 is electrically connected to one or more corresponding pads or other electrical contacts of the substrate 108 via a corresponding array of connectors (not shown), which can include, for example, a BGA, an LGA, a QFP array, C4 bumps, copper (or other metal) pillar structures, solder-free metal-metal bonding, and the like, and well as being mechanically bonded to the second surface 114 via an adhesive or other bonding agent 121.

As the substrate 108 and the semiconductor die component 110 generally are subjected to deformational forces during installation and operation due to thermo-mechanical stresses, the semiconductor package 104 utilizes the annular package lid structure 106 to provide a mechanical solution to diminish or eliminate the warpage or other mechanical deformation that otherwise would result due to the thermo-mechanical stresses. To that end, the annular package lid structure 106 overlies the semiconductor die component 110 and is affixed to the substrate 108 on at least two opposing sides of the semiconductor die component 110. In the illustrated embodiment, the contact region between the annular package lid structure 106 and the substrate 108 entirely encircles the perimeter 122 of the semiconductor die component 110, whereas in other embodiments the contact area(s) between the substrate 108 and the annular package lid structure 106 do not entirely encircle the perimeter 122 of the semiconductor die component 110, such as the annular package lid structure 106 contacting the substrate 108 in discrete, separate locations, such as cutouts in the lid foot at certain locations. The annular package lid structure 106 is composed of a thermally conductive material, or a combination of thermally conductive materials, that provides both mechanical rigidity and thermal conduction. For example, the annular package lid structure 106 can be composed of copper (Cu), a copper alloy, aluminum (Al) or an aluminum alloy, stainless steel (such as SUS304), or silicon carbide (SiC), and may include a plating or other coating of, for example, nickel (Ni) or gold (Au). Further, as described in greater detail below, the annular package lid structure 106 can employ materials that have superior stiffness capabilities while having inferior thermal conductivity capabilities, such as stainless steel in comparison to copper or aluminum, due to one or more apertures implemented in the annular package lid structure 106.

In the example of FIG. 1, the annular package lid structure 106 is a monolithic structure comprising a peripheral flange component 124 that extends substantially parallel with, and proximate to, the surface 114 of the substrate 108 and serves as the interface with the substrate 108, a riser component 126 that extends substantially orthogonal to the surface 114 of the substrate 108 and parallel to the "sides" of the semiconductor die component 110, and a planar component 128 that extends substantially orthogonal to the second surface of the substrate 108 and is proximate to the "top" surface (that is, surface 120) of the semiconductor die component 110. The planar component 128 has a fifth major surface 130 and an opposing sixth major surface 132, wherein the major surface 130 faces the surface 114 of the substrate 108 and is proximate to the surface 120 of the semiconductor die component 110. In the depicted embodiment, the peripheral flange component 124 is affixed to the surface 114 of the substrate 108 via an adhesive layer 134, which may be composed of any of a variety of adhesive materials, such as SE 4450 (DOWSIL™), EW3011 (3M), LA650S (Momentive), 787ST-5A (Shin-Etsu). Alternatively, other mechanical fastening solutions, such as peripheral clamps, rivets, or screws, may be employed to mechanically couple the annular package lid structure 106 to the substrate 108.

In a conventional approach, a package lid would completely enclose the semiconductor die component 110, and this approach, while providing substantial mechanical performance, would negatively impact the thermal performance of any thermal extraction structure mounted on the package lid due to one or both of the material of the package lid that is interposed between the thermal extraction structure and the semiconductor die component 110, as well as the potential thermal inefficiency of the two TIM layers providing a thermal extraction path between the semiconductor die component 110 and the thermal extraction structure through the material of the conventional package lid. Accordingly, to provide improved thermal performance while maintaining the mechanical performance of conventional package lid solutions, in at least one embodiment the annular package lid structure 106 includes an aperture 136 extending between the opposing surfaces 130, 132 of the planar component 128 overlying the semiconductor die component 110, with this aperture 136 being aligned with the surface 120 of the semiconductor die component 110 and substantially devoid of material and thus providing a "hole" by which some or all of the surface 120 of the semiconductor die component 110 can be accessed through the annular package lid structure 106.

Thus, in this approach the package lid structure 106 operates as an "annular" structure in that the material of the planar component 128 of the package lid structure 106 "encircles" the aperture 136 formed therein, and thus the package lid structure 106 is referred to herein as "annular package lid structure 106" for ease of reference. However, it should be noted that the use of the term "annular" is intended as merely a colloquial reference to the formation of the aperture in the package lid structure 106 such that the aperture is enclosed by the surrounding material of the package lid structure 106 and is not intended to necessarily imply or infer a circular nature to the aperture or the package lid structure 106. For example, in FIG. 1 the aperture 136 is a rectangular shape with dimensions smaller than the perimeter 122 of the semiconductor die component 110 such that a portion of the material of the planar component 128 overlies an edge portion of each of the four sides of the surface 120 of the semiconductor die component 110. However, in other embodiments, the aperture 136 can have a shape other than rectangular, such as circular, elliptical, triangular, hexagonal, pentagonal, or irregular. Further, one or more dimensions of the aperture 136 may be larger than the corresponding dimension of the semiconductor die component such that a corresponding edge of the semiconductor die component 110 falls within the "footprint" of the aperture 136. That is, the aperture 136 may extend beyond at least one side of the semiconductor die component 110.

As the aperture 136 provides direct access to the surface 120 of the semiconductor die component 110 through the annular package lid structure 106, a more efficient thermal solution can be employed via the aperture 136 compared to a fully-encapsulating package lid solution while providing substantially equivalent mechanical performance. In some embodiments, and as described below with reference to FIG. 2, the aperture 136 can be utilized to directly thermally couple a heat sink, heat spreader, or similar component of a thermal extraction structure to the surface 120 (via an intervening TIM layer), and thus provide a direct thermal extraction path between the semiconductor die component 110 and the thermal extraction structure via only the intervening TIM layer. In other embodiments, and as described below with reference to FIG. 3, the aperture 136 can be employed to contain a thermally conductive flat plate that serves as an intervening component in the thermal extraction path between the semiconductor die component 110 and the overlying thermal extraction structure. In this approach, the flat plate can be fabricated using a material or combination of materials that is more thermally efficient material than the material(s) of the annular package lid structure 126. Additionally or alternatively, the integration of the flat plate in the void formed by the aperture 136 after board assembly (in case of BGA or other solder-based package-PCB connectors) allows metal-based TIM layers or other TIM layers with higher thermal efficiencies but with lower melting points to be utilized in the thermal extraction path between the semiconductor die component 110 and the overlying thermal exchange structure via the aperture 136, even in implementations that employ BGA or other solder-based connectors 116 and thus require a solder reflow process that otherwise would prevent the use of such TIM layers. The flat plate can also be used with land grid array (LGA), pin grid array (PGA) or any other pin type package-PCB interconnect system and integrated either before or after the PCB assembly.

To this end, a TIM layer 138 (or, alternatively, a non-thermally-conductive adhesive) may be disposed in some or all of the regions of overlap of the material of the planar component 128 and the top surface 120 of the semiconductor die component 110 to provide thermal coupling between the annular package lid structure 106 and the semiconductor die component 110 and thus enhance the thermal performance of the annular package lid structure 106. For example, the TIM layer 138 can completely encompass all of the overlap between the material of the planar component 128 and the top surface 120, or the TIM layer 138 can be utilized at only in select locations of this overlap. Moreover, in some embodiments, the TIM layer 138 may comprise an adhesive-type TIM so as to affix the annular package lid structure 106 to the top surface 120 of the semiconductor die component 110, and thus provide enhanced mechanical protection against warpage.

Figure 2:
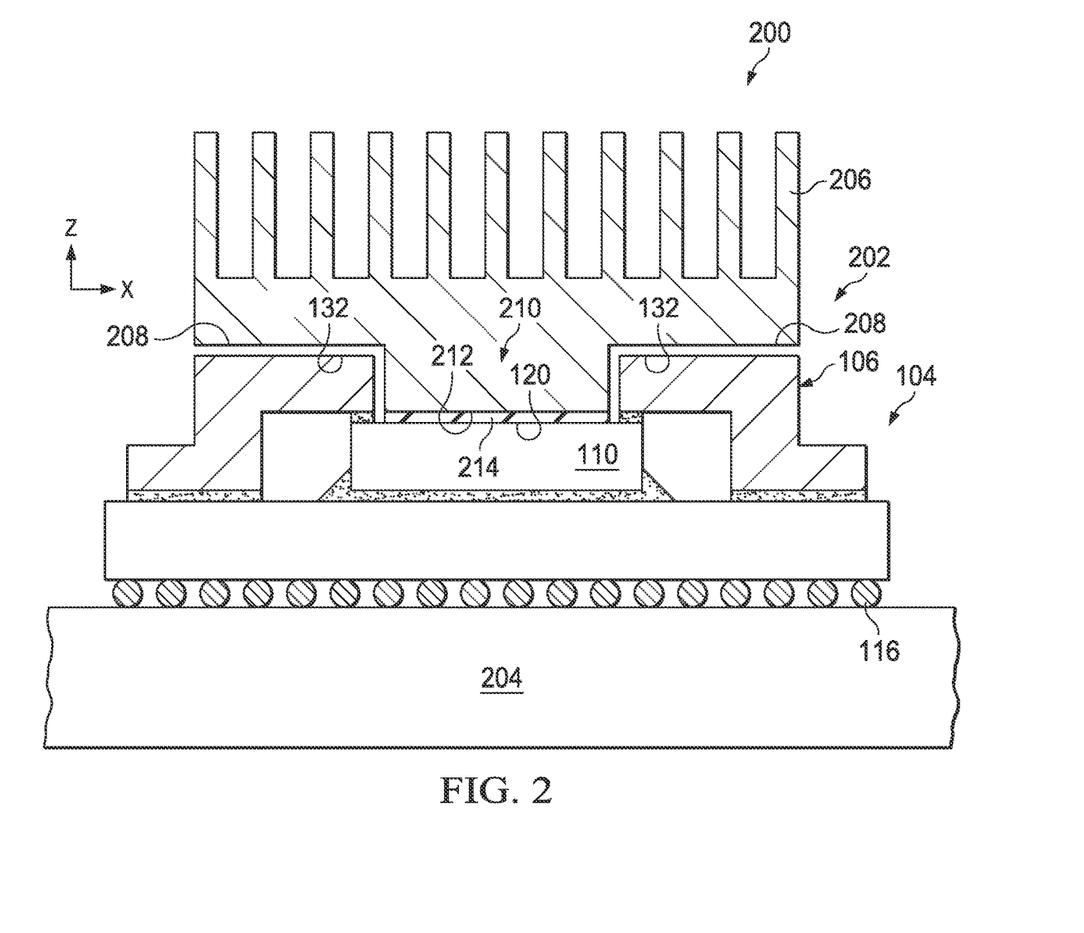
FIG. 2 is a cross-section view of an electronic device having a printed circuit board (PCB) or other carrier structure with the semiconductor package mounted thereon, and further including a thermal extraction structure that is directly thermally coupled to the semiconductor device component via the aperture in accordance with some embodiments.

FIG. 2 illustrates a cross-section view 200 of an electronic device 202 employing the semiconductor package 104 in accordance with some embodiments. The electronic device 202 includes, for example, any of a variety of electronic devices with a high TDP, such as a server, a client workstation, a high-performance graphics card, and the like. The electronic device 202 includes the semiconductor package 104 disposed on a printed circuit board (PCB) or other electrical interconnect carrier structure 204, with the array of connectors 116 providing electrical connections with corresponding electrical contacts (e.g., an array of pads or a socket) of the carrier structure 204. The electronic device 202 further includes a thermal exchange structure 206 disposed atop (relative to the orientation of cross-section view 200) the annular package lid structure 106 of the semiconductor package 104. The thermal exchange structure 206 is illustrated as a heat sink, but in other implementations the thermal exchange structure 206 can include, for example, a heat spreader connected to a passive heat exchanger (e.g., phase change material reservoir) or an active heat exchanger (e.g., heat pipe or circulating fluid structure). The thermal exchange structure 206 is configured with a conformal surface 208 facing the surface 132 of the planar component 128 of the annular package lid structure 106 and having a protrusion 210 that extends into the aperture 136 (FIG. 1) such that a surface 212 of the protrusion 210 is proximate to the surface 120 of the semiconductor die component 110.

A TIM layer 214 is disposed between the surfaces 212 and 120 so as to thermally couple the thermal exchange structure 206 to the semiconductor die component 110 and thus provide a continuous thermal extraction path between the semiconductor die component 110 and the thermal exchange structure 206. The TIM layer 214 thus may be composed of any of a variety of TIMs, such as a thermal paste/grease, a thermal adhesive, a thermal gap filler, a thermal film, a thermal pad, a phase change material (PCM), or a combination thereof. The TIM layer 214 thus may be composed of organic/polymeric material (such as a polymerizable liquid matrix and large volume fractions of electrically insulating, but thermally conductive, filler), which typically has a lower thermal performance but a higher melting point, or a metal-based material, such as an Indium (In) or Indium alloy-based material, that has a higher thermal performance but lower melting point. When the TIM layer 214 employs an adhesive material, the TIM layer 214 can serve to affix the thermal exchange structure 206 to the semiconductor package 104. Alternatively or additionally, the thermal exchange structure 206 can be affixed to the semiconductor package 104 using, for example, an adhesive layer (not shown) between the surface 132 and the surface 208, clamps, screws, and the like, or a combination thereof.

While providing efficient thermal performance due to a direct thermal extraction path between heat source (the semiconductor die component 110) and the thermal exchange structure 206 that need traverse only a single TIM layer (TIM layer 214), the direct-contact approach of FIG. 2 requires that the thermal exchange structure 206 be fabricated with a conformal "bottom" surface with the protrusion 210 having a position and dimensions compatible with the position and dimensions of the aperture 136, and thus potentially limiting the types of thermal exchange structures available for use, or even potentially requiring a custom-made thermal exchange structure.

Figure 3:
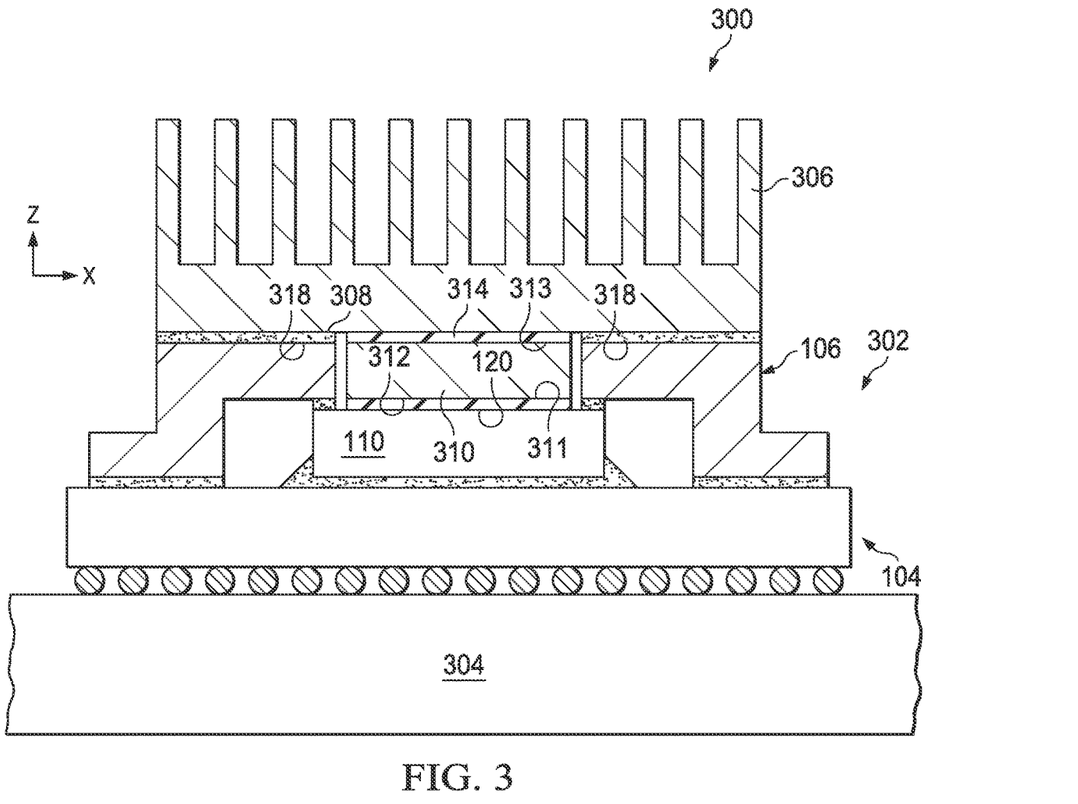
FIG. 3 is a cross-section view of an electronic device having a carrier structure with the semiconductor package mounted thereon, and further having a thermal extraction structure that is indirectly thermally coupled to the semiconductor die component via an interposing thermally conductive plate disposed in the aperture in accordance with some embodiments.

FIG. 3 thus illustrates a cross-section view 300 of an alternative implementation of an electronic device 302 employing the semiconductor package 104 in accordance with some embodiments. In the illustrated configuration, the electronic device 302 includes the semiconductor package 104 disposed on an electrical interconnect carrier 304. The electronic device 302 further includes a thermal exchange structure 306 disposed atop (relative to the orientation of view 300) the annular package lid structure 106 of the semiconductor package 104. While the thermal exchange structure 306 is illustrated as a heat sink, in other implementations the thermal exchange structure 306 can include a different type of thermal exchange structure. Unlike the thermal exchange structure 206 of FIG. 2 having a conformal bottom surface with a protrusion dimensioned for the aperture 136, the thermal exchange structure 306 of FIG. 3 can have a substantially fully planar surface 308, which is typical of heat sinks, heat spreaders, and other passive or active thermal exchange structures that are intended to have a more universal application.

Thus, as the thermal exchange structure 306 lacks a protrusion to extend into the aperture 136 so as to place a portion of the thermal exchange structure in proximity to the surface 120 of the semiconductor die component 110, the electronic device 302 instead employs a thermally conductive plate 310 disposed in the aperture 136 (FIG. 1) and having a seventh major surface 311 thermally coupled to the surface 120 of the semiconductor die component 110 via a TIM layer 312 and an opposing eighth major surface 313 thermally coupled to the planar surface 308 of the thermal exchange structure 306 via a TIM layer 314. Thus, the TIM layer 312, the thermally conductive plate 310, and the TIM layer 314 together provide a thermal extraction path for efficiently transferring thermal energy from the semiconductor die component 110 to the thermal exchange structure 306.

The thermally conductive plate 310, in at least one embodiment, is dimensioned so as to at least partially or completely fill the aperture 136 and, in the embodiment of FIG. 3, having a dimension along an axis (e.g., the illustrated Z-axis) perpendicular to the surface 120 that is substantially even to the dimension of the planar component 128 between surfaces 130 and 132 along the same axis. As a result, a top surface 313 of the thermally conductive plate 310 and the top surface 132 of the annular package lid structure 106 together present a substantially planar combined surface for mating to the substantially planar surface 308 of the thermal exchange structure 306 via one or both of the TIM layer 314 (which may extend to cover some or all of the interface of the surface 132 with the surface 308) or a separate thermal adhesive layer 318 between the surface 132 and the surface 308.

The use of a separate thermally conductive plate 310 disposed in the aperture 136 of the annular package lid structure 106 provides a substantially continuous mating surface for mounting a thermal exchange structure 306 similar to a conventional package lid that entirely encompasses the underlying semiconductor die component while facilitating certain fabrication processes and materials that are impracticable using such conventional package lids. To illustrate, in many instances materials providing enhanced mechanical and structural support, such as copper or aluminum, and thus well suited for use as the material of the package lid structure 106 often have lower thermal performance than other materials, such as graphite-based materials, but these higher thermal performance materials may not have structural integrity sufficient for use as a package lid. Accordingly, the material of the package lid structure 106 may be selected with an emphasis on mechanical performance, while the material of the thermally conductive plate 310 may be selected with an emphasis on thermal performance, and thus providing a package lid structure 106 with the equivalent thermal and mechanical performance of a fully-encapsulating package lid while providing improved thermal performance through the use of the interposed thermally conductive plate 310 located in the aperture 136.

Further, metal-based TIMs, which typically have higher thermal performance but lower melting points than organic/polymeric TIMs, typically cannot be used in a conventional lidded package implementation when the package is mounted to a corresponding PCB or other carrier via a solder reflow process as the temperature required for the solder reflow process typically is higher than the melting points of metal-based TIMs, and thus such metal-based TIMs typically excessively degrade during the solder reflow process. However, in the annular package lid structure and thermally conductive plate combination of FIG. 3, the semiconductor package 104 can be provided without the thermally conductive plate 310 in place and mounted on the carrier 204 using a solder reflow process. After mounting, a metal-based TIM layer 312 can be formed in the aperture 136, the thermally conductive plate 310 can be mounted in the aperture 136 in contact with the metal-based TIM layer 312, a metal-based or polymer TIM layer 314 can be formed on the thermally conductive plate 310, and then the thermal exchange structure 306 can be mounted on the package lid structure 106 and the thermally conductive plate 310 in contact with the metal-based or polymer TIM layer 314. That is, because the thermally conductive plate 310 can be installed subsequent to package mounting, metal-based TIM can be used for the thermally conductive plate 310 without needing to subject them to the temperatures involved in a solder-reflow process.

Figure 4:
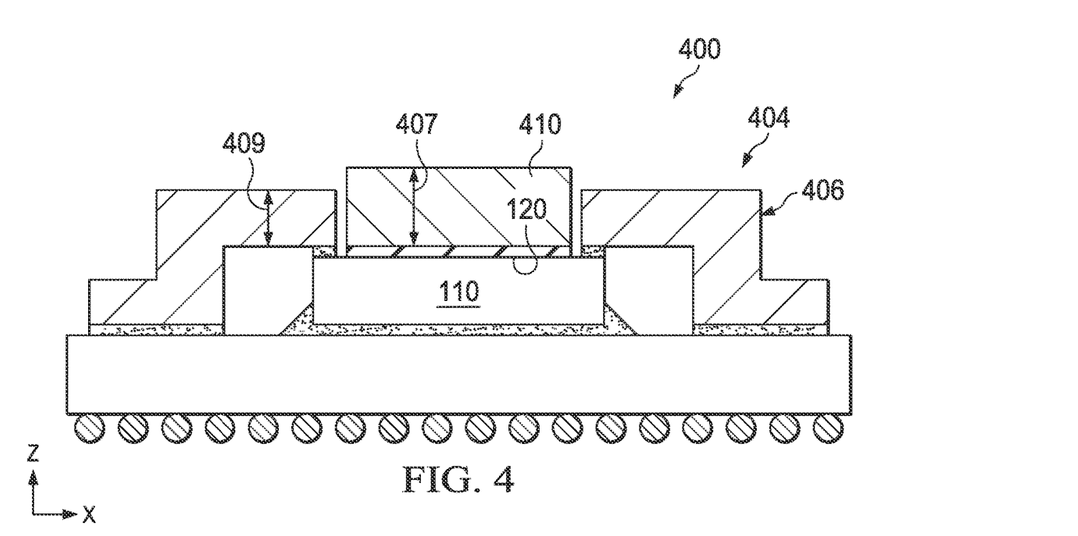
FIGS. 4 and 5 are cross-section views of semiconductor packages employing different sized configurations of the thermally conductive plate of FIG. 3 in accordance with some embodiments.
Figure 5:
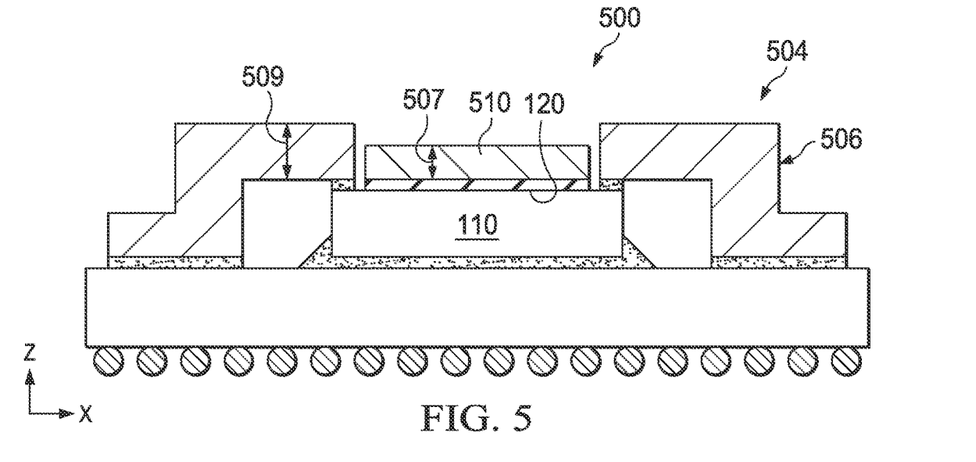

Although the embodiment of FIG. 3 illustrates a thermally conductive plate 310 dimensioned so as to have a "thickness" substantially equal to the thickness of the planar component 128 so as to provide a substantially flat mating surface for the thermal extraction structure 306, in other embodiments a thermally conductive plate of a greater or lesser thickness can be employed. For example, referring briefly to the cross-section view 400 of FIG. 4, a semiconductor package 404 (one embodiment of semiconductor package 104) employs a thermally conductive plate 410 disposed in an aperture of a corresponding annular package lid structure 406 (one embodiment of the annular package lid structure 106) that has a dimension 407 along an axis (e.g., the illustrated Z-axis) perpendicular to the surface 120 of the semiconductor die component 110 that is greater than a dimension 409 of the annular package lid structure 406 proximate to the aperture. That is, the top surface of the thermally conductive plate 410 can be "above" the top surface of the annular package lid structure 406. Conversely, referring briefly to the cross-section view 500 of FIG. 5, a semiconductor package 504 (one embodiment of semiconductor package 104) employs a thermally conductive plate 510 disposed in an aperture of a corresponding annular package lid structure 506 (one embodiment of the annular package lid structure 106) that has a dimension 507 along an axis perpendicular to the surface 120 of the semiconductor die component 110 that is greater than a dimension 509 of the annular package lid structure 506 proximate to the aperture. That is, the top surface of the thermally conductive plate 410 could be "below" the top surface of the annular package lid structure 406. In either instance, a facing surface of a thermal exchange structure to be affixed to the semiconductor package either can be fabricated to conform to the protrusion or indention caused by the thermally conductive plate 410 or thermally conductive plate 510, respectively, or the resulting non-planarity of the combined surface presented by the combination of the annular package lid structure and thermally conductive plate disposed therein can be accommodated by the TIM layer and/or adhesive layer used between the two facing surfaces.

Figure 6:
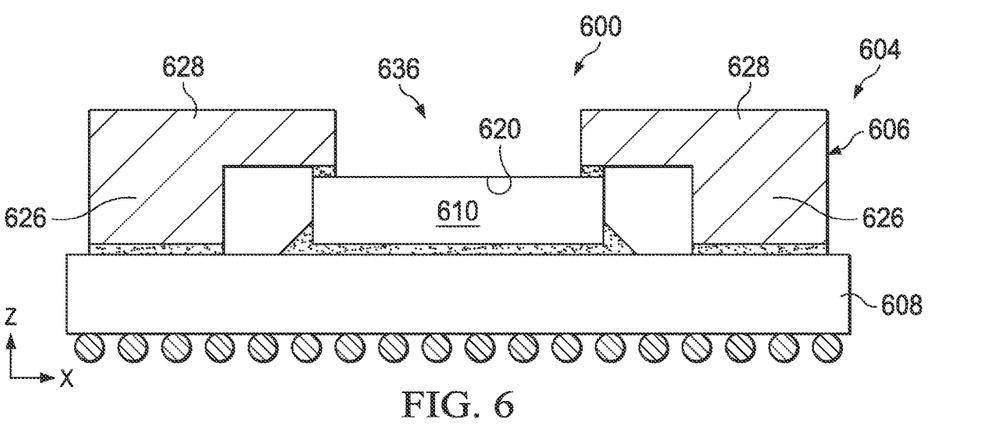
FIG. 6 is a cross-section view of a semiconductor package employing a flangeless package lid structure with an aperture to provide access to a surface of an underlying semiconductor device component in accordance with some embodiments.

While FIGS. 1-5 illustrate an example implementation of the annular package lid structure 106 as a monolithic structure that incorporates a mounting flange (flange component 124, FIG. 1), it should be appreciated that the annular package lid structure is not limited to a monolithic implementation, nor to a particular overall shape or form. For example, referring to FIG. 6, a cross-section view 600 of an alternative implementation of a semiconductor package 604 (one embodiment of semiconductor package 104) is illustrated, in which an annular package lid structure 606 is mounted on a substrate 608 and overlying a semiconductor die component 610 and with an aperture 636 aligned with the semiconductor die component 610 so as to provide access to a top surface 620 of the semiconductor die component 610. In this implementation, the annular package lid structure 606 is a flangeless monolithic structure composed of a riser component 626 and a planar component 628. The riser component extends along an axis (e.g., the illustrated Z-axis) perpendicular to the facing surface of the substrate 608 and at least partially encircles the semiconductor die component 610 and the planar component 628, in which the aperture 636 is formed, extends from the riser component 626 in a direction substantially parallel to the facing surface of the substrate 608.

Figure 7:
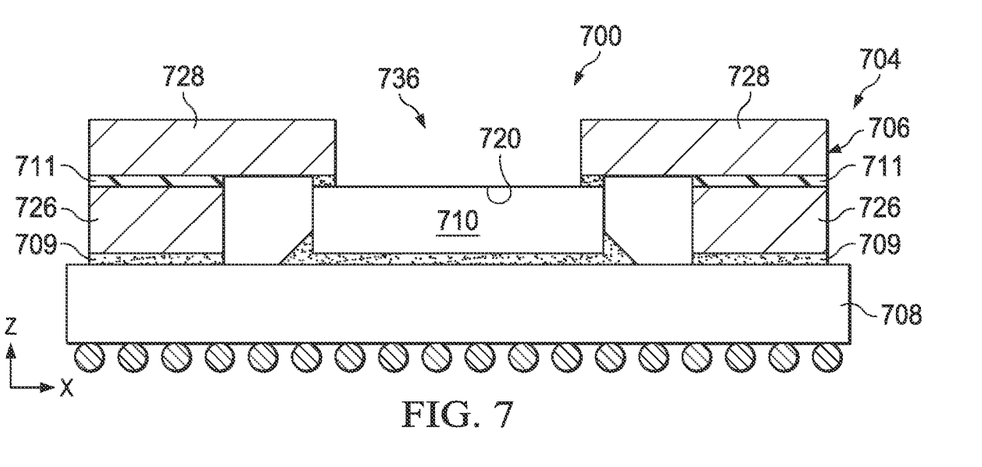
FIG. 7 is a cross-section view of a semiconductor package employing a polylithic package lid structure with an aperture to provide access to a surface of an underlying semiconductor device component in accordance with some embodiments.

As another example, referring to FIG. 7, a cross-section view 700 of another alternative implementation of a semiconductor package 704 (one embodiment of semiconductor package 104) is illustrated, in which an annular package lid structure 706 is mounted on a substrate 708 and overlying a semiconductor die component 710 and with an aperture 736 aligned with the semiconductor die component 710 so as to provide access to a top surface 720 of the semiconductor die component 710. In this implementation, the annular package lid structure 706 is a flangeless polylithic (or segmented) structure composed of a riser segment component 726 and a separately fabricated planar segment component 728. The riser segment component 726 extends along an axis perpendicular to the facing surface of the substrate 708 and at least partially encircles the semiconductor die component 710 and is mounted to the facing surface of the substrate 708 via an adhesive layer 709. The planar segment component 728, in which the aperture 736 is formed, extends from the riser component 726 in a direction substantially parallel to the facing surface of the substrate 708 and is mechanically attached via an adhesive layer 711. It will be appreciated that the flanged implementation of the package lid structure 106 likewise can be implemented in a similar polylithic structure approach where one or more of the flange component, riser component, or planar component are separately fabricated and affixed to the other components via an adhesive layer or other fastening solution.

While FIGS. 1-7 illustrate implementations of an annular package lid structure that utilizes a single aperture to provide direct access to the surface of a semiconductor die component through the annular package lid structure, the present disclosure is not limited to a single aperture implementation. Rather, the annular package lid structure may employ multiple apertures for providing multiple direct thermal extraction paths to the semiconductor die component through the annular package lid structure. Multiple apertures thus may be employed to provide increased structural rigidity compared to a single larger aperture, or to facilitate different types of thermal coupling, such as one or more apertures for direct coupling to a heat dispersion structure and one or more other apertures for indirect coupling to a heat dispersion structure via an interposing thermally conductive plate.

Figure 8:
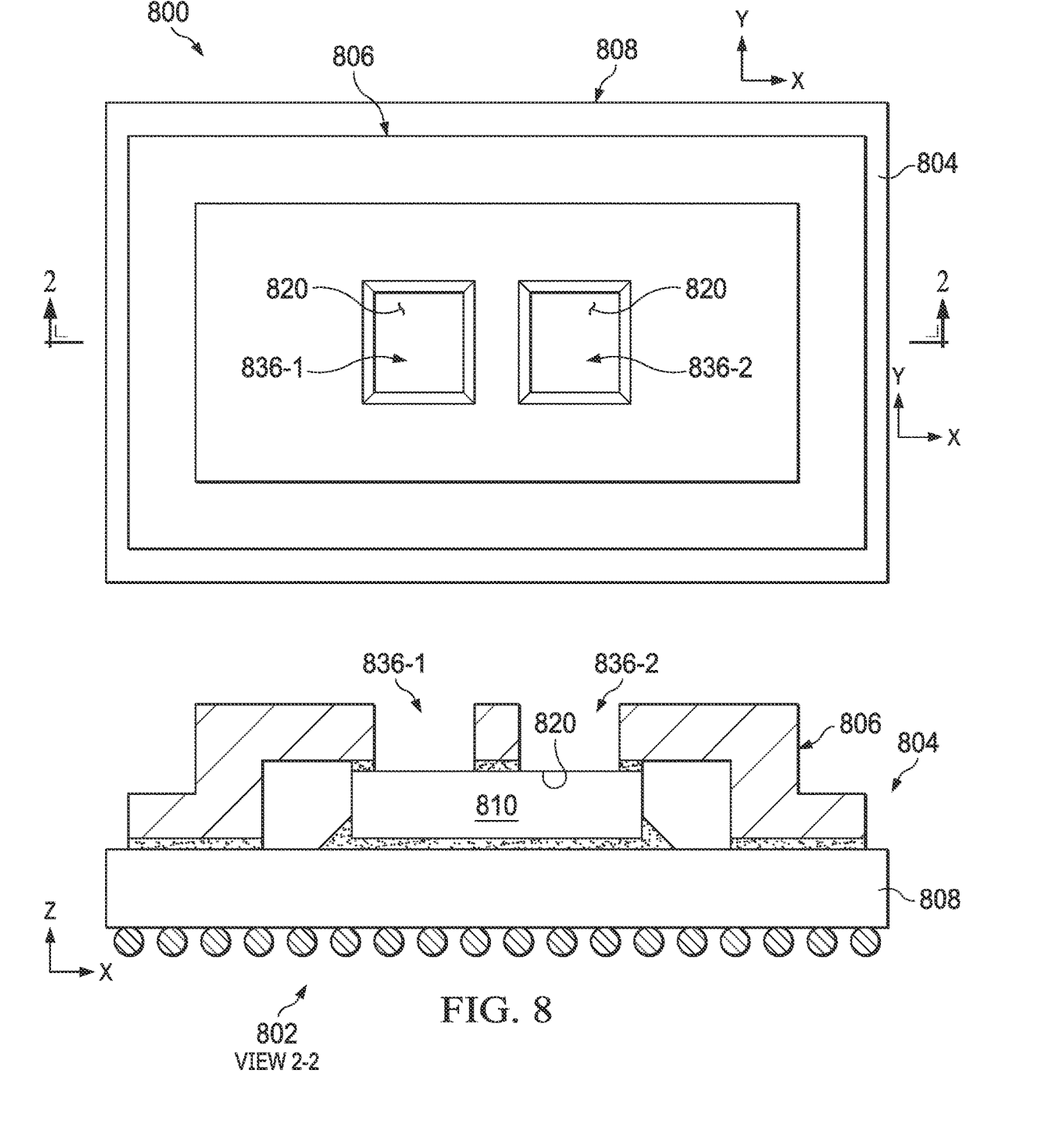
FIG. 8 is a top view and cross-section view of a semiconductor package having a package lid structure with multiple apertures to provide access to a surface of an underlying semiconductor device component in accordance with some embodiments.

To illustrate, FIG. 8 illustrates a top view 800 and a cross-section view 802 along line 2-2 of an example implementation of a semiconductor package 804 employing an annular package lid structure 806 (one embodiment of the annular package lid structure 106) affixed to a substrate 808 and overlying a semiconductor die component 810. In this implementation, the annular package lid structure 806 employs two apertures, aperture 836-1 and aperture 836-2, that provide access to a surface 820 of the semiconductor die component 810. A thermal exchange structure then may be mounted on the annular package lid structure 806 with a facing conformal surface with two protrusions to provide direct contact between the surface 820 and the thermal exchange structure via corresponding TIM layers. Alternatively, a thermally conductive plate may be disposed in each of the apertures 836-1, 836-2 to provide interposing thermally conductive paths, along with corresponding TIM layers, between the surface 820 and the facing surface of the thermal exchange structure. Still further, two thermal exchange structures may be implemented, each utilizing a corresponding one of the apertures 836-1, 836-2.

Figure 9:
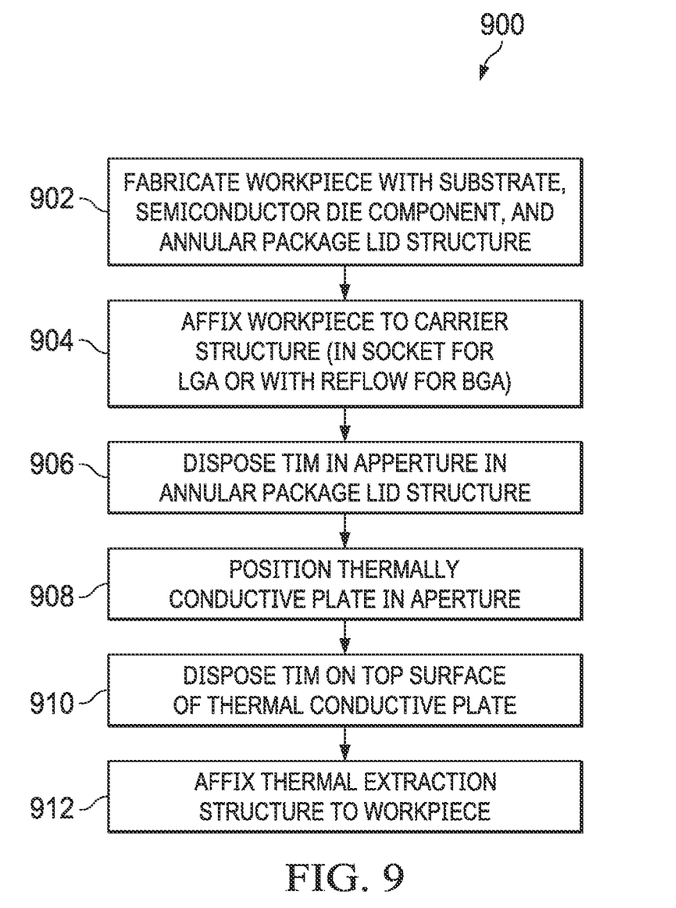
FIG. 9 is a flow diagram illustrating a method for fabricating an electronic device comprising a semiconductor package having a package lid structure with an aperture to provide access to a surface of an underlying semiconductor device component in accordance with some embodiments.

FIG. 9 illustrates an example method 900 of fabrication of an electronic device having a semiconductor package with an annular package lid structure in accordance with some embodiments. The electronic device may include, for example, any of a variety of devices with a high TDP, such as a server, a client workstation, a graphics card, and the like. The method 900 initiates at block 902 with the fabrication of a workpiece composed of a semiconductor die component mounted on a substrate, and then the mounting of an annular package lid structure to one or both of the substrate or the semiconductor die component such that the annular package lid structure overlies the semiconductor die component and has one or more apertures that expose a top surface of the semiconductor die component.

At block 904, the workpiece is mounted to a PCB or other carrier structure. In instances in which the workpiece utilizes an LGA or other pin-based connectors, this mounting process can include mounting the workpiece in a socket or similar receptacle of the carrier. In instances in which the workpiece utilizes solder-based connectors, such as BGA, the mounting process includes a solder reflow process in which the workpiece and carrier are subjected to a temperature for a duration sufficient to cause at least partial reflow of the solder-based connectors, and thus providing electrical and mechanical coupling between the solder-based connectors and corresponding pads of the carrier structure. At block 906, a TIM layer is disposed in each of the one or more apertures of the workpiece on the top surface of the underlying semiconductor die component. Because the TIM layer is disposed following any solder reflow process for mounting the workpiece to the carrier, the TIM layer can use a metal-based TIM having a melting point lower than the temperature used for a solder reflow process.

In implementations utilizing a thermally conductive plate as an interposer, at block 908 a thermally conductive plate is positioned in the aperture and placed in contact with the TIM layer applied at block 906 and then another TIM layer is disposed on a top surface of the thermally conductive plate. As with the TIM layer formed at block 906, this second TIM layer likewise can be composed of a metal-based TIM or other TIM with a relatively low melting point as any solder reflow process has already been performed. In implementations utilizing a thermal exchange structure with a protrusion to occupy the aperture so as to provide proximate contact, the processes of blocks 908 and 910 are omitted.

At block 912, one or more thermal exchange structures, such as a heat sink, heat spreader, heat pipe, PCM reservoir, fluid circulator, or a combination thereof, are affixed to the workpiece, and more particularly to the top surface of the annular package lid structure such that the thermal exchange structure is thermally coupled to the top surface of the semiconductor die component either via a corresponding protrusion that extends into the aperture and contacts the TIM layer formed at block 906 or via the thermally conductive plate positioned in the aperture at block 908 and the TIM layers formed at blocks 906 and 910, depending on implementation. Further fabrication processes, such as the mounting of a cooling fan, the connection of power lines and data lines, and the like, then may be performed.

In some embodiments, the apparatus and techniques described above are implemented in a system including one or more integrated circuit (IC) devices (also referred to as integrated circuit packages or microchips), such as the semiconductor packages described above with reference to FIGS. 1-9. Electronic design automation (EDA) and computer-aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer-readable storage medium accessible to the computing system. Likewise, the code representative of one or more phases of the design or fabrication of an IC device may be stored in and accessed from the same computer-readable storage medium or a different computer-readable storage medium.

A computer-readable storage medium may include any non-transitory storage medium, or combination of non-transitory storage media, accessible by a computer system during use to provide instructions and/or data to the computer system. Such storage media can include, but is not limited to, optical media (e.g., compact disc (CD), digital versatile disc (DVD), Blu-ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer-readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may be implemented by one or more processors of a processing system executing software. The software includes one or more sets of executable instructions stored or otherwise tangibly embodied on a non-transitory computer-readable storage medium. The software can include the instructions and certain data that, when executed by the one or more processors, manipulate the one or more processors to perform one or more aspects of the techniques described above. The non-transitory computer-readable storage medium can include, for example, a magnetic or optical disk storage device, solid-state storage devices such as Flash memory, a cache, random access memory (RAM) or other non-volatile memory device or devices, and the like. The executable instructions stored on the non-transitory computer-readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A semiconductor package comprising:
    a substrate having a first surface and a second surface opposing the first surface;
    a semiconductor chip component disposed at the second surface of the substrate and having a third surface facing the second surface of the substrate and a fourth surface opposing the third surface;
    a package lid structure comprising a first material, the package lid structure affixed to the second surface of the substrate, the package lid structure comprising a planar component overlying the semiconductor chip component and having a fifth surface facing the fourth surface and a sixth surface opposing the fifth surface, the planar component comprising an aperture extending between the fifth surface and the sixth surface so as to expose at least a portion of the fourth surface of the semiconductor chip component; and
    a thermally conductive plate comprising a second material, the thermally conductive plate disposed in the aperture of the package lid structure and having a seventh surface that is thermally coupled to the fourth surface of the semiconductor chip component and an eighth surface opposing the seventh surface that is substantially planar with the sixth surface,
    wherein the second material has a higher thermal conductivity than the first material, and wherein the first material has a higher rigidity than the second material.

2. The semiconductor package of claim 1, wherein the first material comprises one or more of copper, a copper alloy, aluminum, an aluminum alloy, stainless steel, silicon carbide, nickel, or gold, and wherein the second material comprises a graphite-based material.

3. The semiconductor package of claim 1, wherein the seventh surface is thermally coupled to the fourth surface using one of a metal-based thermal interface material or a polymeric thermal interface material.

4. The semiconductor package of claim 1, wherein a dimension between the fifth surface and the sixth surface is one of: equal to a dimension between the seventh surface and the eighth surface; less than the dimension between the seventh surface and the eighth surface; or greater than the dimension between the seventh surface and the eighth surface.

5. The semiconductor package of claim 1, further comprising:
    a thermal exchange structure affixed to the sixth surface of the planar component of the package lid structure and thermally coupled to the eighth surface of the thermally conductive plate via a thermal interface material.

6. The semiconductor package of claim 5, wherein the thermal interface material is a metal-based thermal interface material.

7. The semiconductor package of claim 6, further comprising:
    an array of solder-based connectors disposed at the first surface of the substrate.

8. The semiconductor package of claim 1, wherein the package lid structure is thermally coupled to at least a portion of a perimeter of the fourth surface of the semiconductor chip component via a thermal interface material.

9. The semiconductor package of claim 1, wherein the package lid structure comprises a monolithic structure comprising the planar component and a riser component extending between the planar component and the second surface of the substrate.

10. The semiconductor package of claim 1, wherein the package lid structure comprises a polylithic structure comprising:
    a planar segment component comprising the planar component, the planar segment component having a perimeter that extends beyond a perimeter of the semiconductor chip component; and
    a separate riser segment component structure affixed to the perimeter of the planar segment component that extends beyond the perimeter of the semiconductor chip component via at least one adhesive layer.

11. The semiconductor package of claim 1, wherein:
    the package lid structure is thermally coupled to the fourth surface of the semiconductor chip component via a metal-based thermal interface material; and
    the semiconductor package further comprises an array of solder-based connectors disposed at the first surface of the substrate,
    wherein a melting point of the metal-based thermal interface material is lower than a melting point of a solder of the solder-based connectors.

12. The semiconductor package of claim 1, further comprising:
    a thermal exchange structure that is thermally coupled, using a thermal interface material, to the eighth surface.

13. The semiconductor package of claim 12, further comprising:
    an array of solder-based connectors disposed at the first surface of the substrate; and
    wherein the thermal interface material comprises a metal-based thermal interface material with a melting point lower than a melting point of a solder of the solder-based connectors.

14. The semiconductor package of claim 12, wherein the thermal exchange structure comprises a substantially planar surface facing the sixth surface and the eighth surface.

15. The semiconductor package of claim 12, wherein the thermal exchange structure comprises one of a heat sink, a heat spreader, a heat pipe, a phase change material reservoir, or a fluid circulation structure.

16. The semiconductor package of claim 1, wherein the semiconductor chip component comprises one of an integrated circuit die or a molded chip module.

17. A system comprising:
    a carrier structure having a ninth surface; and the semiconductor package of claim 1 disposed at the ninth surface.

18. The system of claim 17, wherein the system comprises one of a server, a client workstation, or a graphics card.

19. A method comprising:
providing a workpiece comprising a substrate having a first surface and a second surface opposing the first surface, and a semiconductor chip component disposed at the second surface of the substrate and having a third surface facing the second surface of the substrate and a fourth surface opposing the third surface;
affixing a package lid structure, the package lid structure comprising a first material, to the second surface of the substrate and thermally coupling the package lid structure to the fourth surface of the semiconductor chip component via a thermal interface material, the package lid structure comprising a planar component overlying the semiconductor chip component and having a fifth surface facing the fourth surface and a sixth surface opposing the fifth surface, the planar component comprising an aperture extending between the fifth surface and the sixth surface so as to expose at least a portion of the fourth surface of the semiconductor chip component; and
positioning a thermally conductive plate comprising a second material in the aperture of the package lid structure such that a seventh surface of the thermally conductive plate faces, and is thermally coupled to, the fourth surface of the semiconductor chip component, and an eighth surface of the thermally conductive plate is substantially planar with the sixth surface,
wherein the second material has a higher thermal conductivity than the first material, and wherein the first material has a higher rigidity than the second material.

20. The method of claim 19, wherein the first material comprises one or more of copper, a copper alloy, aluminum, an aluminum alloy, stainless steel, silicon carbide, nickel, or gold, and wherein the second material comprises a graphite-based material.

21. The method of claim 19, further comprising:
affixing a thermal exchange structure to at least one of the sixth surface of the planar component of the package lid structure; and
thermally coupling the thermal exchange structure to the eighth surface of the thermally conductive plate opposite of the seventh surface via a thermal interface material.

22. The method of claim 21, further comprising:
prior to positioning the thermally conductive plate and affixing the thermal exchange structure, performing a solder reflow process to reflow an array of solder-based connectors disposed at the first surface of the substrate; and
subsequent to the solder reflow process, disposing a thermal interface material in the aperture at the fourth surface, the thermal interface material having a melting point lower than a melting point of a solder of the solder-based connectors.

23. The method of claim 19, further comprising:
disposing a thermal interface material in the aperture at the fourth surface of the semiconductor chip component; and
affixing a thermal exchange structure to at least one of the sixth surface of the planar component of the package lid structure.

24. The method of claim 23, further comprising:
prior to disposing the thermal interface material and affixing the thermal exchange structure, performing a solder reflow process to reflow an array of solder-based connectors disposed at the first surface of the substrate; and
wherein the thermal interface material has a lower melting point than a solder of the solder-based connectors.

* * * * *